(12) United States Patent
Ciraldo et al.

(10) Patent No.: US 12,480,224 B2
(45) Date of Patent: Nov. 25, 2025

(54) METHOD FOR FORMING DIAMOND HAVING A DESIRABLE COLOR BY CHEMICAL VAPOR DEPOSITION COMPRISING GROWING A DOPED DIAMOND LAYER ON A SINGLE CRYSTAL SUBSTRATE

(71) Applicant: Advanced Diamond Holdings, LLC, Beltsville, MD (US)

(72) Inventors: John P. Ciraldo, Chicago, IL (US); Jonathan Levine-Miles, Chicago, IL (US)

(73) Assignee: Advanced Diamond Holdings, LLC, Beltsville, MD (US)

( * ) Notice: Subject to any disclaimer, the term of this patent is extended or adjusted under 35 U.S.C. 154(b) by 0 days.

(21) Appl. No.: 17/150,751

(22) Filed: Jan. 15, 2021

(65) Prior Publication Data

US 2021/0222324 A1   Jul. 22, 2021

Related U.S. Application Data

(60) Provisional application No. 62/962,461, filed on Jan. 17, 2020.

(51) Int. Cl.
*C30B 25/16* (2006.01)
*C30B 29/04* (2006.01)

(52) U.S. Cl.
CPC .............. *C30B 29/04* (2013.01); *C30B 25/16* (2013.01)

(58) Field of Classification Search
CPC ......... C30B 25/00; C30B 25/02; C30B 25/16; C30B 25/165; C30B 25/18; C30B 25/183; C30B 25/20; C30B 25/22; C30B 29/00; C30B 29/02; C30B 29/04; C23C 16/22; C23C 16/26; C23C 16/27
USPC ............................. 117/84, 88, 105, 928–929
See application file for complete search history.

(56) References Cited

U.S. PATENT DOCUMENTS

| 5,474,021 A | 12/1995 | Tsuno et al. |
| 2007/0148374 A1 | 6/2007 | Twitchen et al. |
| 2007/0157875 A1 | 7/2007 | Hemley et al. |
| 2008/0311024 A1 | 12/2008 | Meguro et al. |

(Continued)

FOREIGN PATENT DOCUMENTS

| WO | 2019145407 A1 | 8/2019 | |
| WO | 2020/008044 A1 | 1/2020 | |
| WO | WO-2021030557 A1 * | 2/2021 | ......... B01D 53/0407 |

OTHER PUBLICATIONS

International Search Report and Written Opinion for PCT/US2021/13692, mailed Apr. 26, 2021 (10 pages).

(Continued)

*Primary Examiner* — Kenneth A Bratland, Jr.
(74) *Attorney, Agent, or Firm* — Nutter McClennen & Fish LLP (57) ABSTRACT

A diamond includes a first dopant configured to cause the diamond to have a first color. The diamond also includes a second dopant configured to cause the diamond to have a second color. Furthermore, the diamond includes a third dopant configured to cause the diamond to have a third color. The combined color of the first, second, and third dopants in the diamond mitigate the detrimental effect of the first and second dopant on the color of the diamond.

20 Claims, 5 Drawing Sheets

(56) References Cited

U.S. PATENT DOCUMENTS

| | | | |
|---|---|---|---|
| 2010/0015438 A1* | 1/2010 | Williams | C30B 25/105 |
| | | | 428/408 |
| 2010/0123098 A1* | 5/2010 | Hemley | C30B 29/04 |
| | | | 117/103 |
| 2010/0126406 A1 | 5/2010 | Yan et al. | |
| 2012/0047950 A1* | 3/2012 | Grotjohn | C30B 29/04 |
| | | | 63/32 |
| 2014/0137795 A1 | 5/2014 | Chang et al. | |
| 2014/0150713 A1* | 6/2014 | Coe | H01J 37/32192 |
| | | | 117/88 |
| 2015/0240381 A1 | 8/2015 | Linares et al. | |
| 2018/0236515 A1 | 8/2018 | Nishibayashi et al. | |

OTHER PUBLICATIONS

International Search Report and Written Opinion for PCT/US2021/14154, mailed Apr. 21, 2021 (13 pages).

* cited by examiner

METHOD FOR FORMING DIAMOND HAVING A DESIRABLE COLOR BY CHEMICAL VAPOR DEPOSITION COMPRISING GROWING A DOPED DIAMOND LAYER ON A SINGLE CRYSTAL SUBSTRATE

PRIORITY

The present application claims priority to provisional U.S. patent application Ser. No. 62/962,461, filed Jan. 17, 2020, entitled MULTI-DOPED DIAMOND FORMATION, and naming John P. Ciraldo and Jonathan Levine-Miles as inventors, the entirety of which is incorporated herein by reference.

FIELD OF THE INVENTION

Illustrative embodiments of the invention generally relate to formation of diamond on substrate and, more particularly, the illustrative embodiments of the invention relate to introducing dopants into the diamond formation process.

BACKGROUND OF THE INVENTION

The synthesis of gem grade diamond by chemical vapor deposition has become commonplace recently. However, diamond material produced by this technology frequently demonstrate non-desirable coloration. Fabricating white CVD diamond can present a number of technical challenges.

SUMMARY OF VARIOUS EMBODIMENTS

In accordance with one embodiment of the invention, a method of forming a CVD diamond provides a single-crystal substrate. The method grows a first doped diamond layer directly or indirectly on the substrate. The first doped diamond layer includes a first dopant, a second dopant, and a third dopant. Each of the dopants is different from one another and selected from the list of: boron, silicon, nitrogen, phosphorous, arsenic, germanium, and aluminum.

In various embodiments, at least one of the first dopant, the second dopant, and/or the third dopant is a primary dopant. Another one of the first dopant, the second dopant, and/or the third dopant is a secondary dopant. The concentration of the first dopant, the second dopant, and/or the third dopant. Particularly, a second doped diamond layer may be grown directly or indirectly on the first diamond layer after the concentrations are adjusted. In some embodiments, adjusting the concentration defines a new primary dopant. In some embodiments, the second doped diamond layer has a different color from the first doped diamond layer.

In a similar manner, the concentration of the first dopant, the second dopant, and/or the third dopant may be adjusted a second time. A third doped diamond layer may be grown directly or indirectly on the second diamond layer after adjusting the concentration.

In accordance with yet another embodiment of the invention, a method of forming a CVD diamond provides a single-crystal substrate. The method grows a first doped diamond layer directly or indirectly on the substrate. The first doped diamond layer includes a first dopant and a second dopant. The method also grows a second doped diamond layer. The second doped diamond layer includes a third dopant that is different from the first dopant and the second dopant. Each of the dopants is selected from the list of: boron, silicon, nitrogen, phosphorous, arsenic, germanium, and aluminum.

In accordance with yet another embodiment of the invention, a method of forming a CVD diamond provides a single-crystal substrate. The method grows a first doped diamond layer directly or indirectly on the substrate. The first doped diamond layer includes a first dopant. The method also grows a second doped diamond layer that includes a second dopant. The method also grows a third doped diamond layer that includes a third dopant. Each of the dopants is selected from the list of: boron, silicon, nitrogen, phosphorous, arsenic, germanium, and aluminum.

The growth of the first doped diamond layer, the second doped diamond layer, and/or the third doped diamond layer may be repeated to form a super-lattice. In accordance with yet another embodiment, a method of forming a CVD diamond provides a single-crystal substrate. The method also provides a CVD growth environment in which there exists a gas comprising nitrogen. The method also adds boron and silicon into the CVD diamond growth environment, wherein the boron and silicon are added in a controlled manner into the CVD diamond growth environment to reduce a detrimental effect on color of the single crystal CVD diamond.

In some embodiments, the boron is substantially removed from the CVD growth environment before the silicon is added. Among other things, a concentration of the boron in the CVD growth environment may be reduced as a concentration of the silicon is increased. In some other embodiments, the silicon is substantially removed from the CVD growth environment before the boron is added. Among other things a concentration of the silicon in the CVD growth environment may be reduced as a concentration of the boron is increased.

In some embodiments, the silicon and the boron may be simultaneously present in the CVD growth environment. In some other embodiments, the method grows alternating layers of boron-doped diamond and silicon-doped diamond. Additionally, both the boron-doped diamond layer and the silicon-doped diamond layer may be nitrogen-doped.

In accordance with yet another embodiment, a diamond wafer has a plurality of layers. The diamond wafer includes a first dopant configured to cause the diamond to have a first color. The diamond wafer also includes a second dopant configured to cause the diamond to have a second color. Furthermore, the diamond wafer includes a third dopant configured to cause the diamond to have a third color. The colors of the first, second, and third dopants in the diamond wafer are combined so as to mitigate the detrimental effect of the first and second dopant on the color of the diamond wafer.

In some embodiments, the first dopant is nitrogen, the second dopant is boron, and the third dopant is silicon. In some other embodiments, the first dopant is nitrogen, the second dopant is silicon, and the third dopant is boron.

In accordance with yet another embodiment, a method of forming a CVD diamond provides a single-crystal substrate. A doped diamond is grown by chemical vapor deposition directly or indirectly on the substrate. The doped diamond includes a first dopant, a second dopant, and a third dopant. Each of the dopants is different from one another and is selected from the list of: boron, silicon, nitrogen, sulfur, phosphorous, arsenic, nickel, germanium, cobalt, and aluminum.

In some embodiments, the doped diamond includes a homogeneous mixture of the first dopant, the second dopant, and the third dopant. In some other embodiments, the doped diamond comprises a plurality of layers, and each layer having at least one of the first dopant, the second dopant, and the third dopant.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a plurality of dopants are introduced into the diamond growth process to produce a crystal having desired color characteristics. For example, various dopants (e.g., boron, silicon, nitrogen, etc.) introduced during the diamond growth process can cause various color characteristics in the diamond. By introducing a plurality of dopants, either simultaneously or sequentially, the inventors discovered that it is possible to manipulate the color of the overall grown diamond. Particularly, the effect of a non-desirable color of the diamond caused by a single dopant (e.g., nitrogen) may be reduced (e.g., to increase the quality of the color of the diamond). Thus, one or more dopants are introduced during the diamond growth process to improve the color of the overall diamond crystal.

Nitrogen is commonly incorporated into diamond during CVD growth. In some instances, the incorporation of the nitrogen dopant is intentional (e.g., to improve the crystalline structure, rate of growth, or other properties related to the growth of diamond). In some other instances, nitrogen is unintentionally introduced due to contamination in the growth environment. Regardless of the cause, in some embodiments, the nitrogen dopant may cause non-desirable coloration in the grown crystals. For example, the presence of nitrogen within crystals tends to result in yellow to brown discoloration. Generally, the larger the concentration of nitrogen, the stronger the discoloration of the crystal.

In illustrative embodiments, a second dopant (e.g., in addition to the nitrogen dopant) is added to the diamond (e.g., to the crystal layer containing nitrogen and/or to a sequential crystal layer). For example, the addition of boron on top of, or into, the nitrogen-doped crystal layer may produce a blue discoloration, which lessens the optical impact of the yellow nitrogen discoloration. However, the combination of the two dopants may also result in an undesirable visual appearance (e.g., green tint to the appearance of the diamond).

Further complicating the color characteristic of the diamond is that results from the impurities/dopants are dependent on growth conditions. For example, the color imparted by nitrogen impurities can vary from dark brown to very light yellow, depending on atomic concentration, and temperature during growth, among other factors. These complications produce further challenges when attempting to mitigate the color, as mitigation efforts generally rely on prediction of the resultant color.

The inventors discovered, and were surprised to find, that the addition of a third dopant, which in insolation discolors the crystal, mitigates the detrimental effect of the first and second dopant on the color of the diamond. In other words, the addition of a third dopant in the diamond growth process provides a desirable visual appearance (e.g., makes the diamond whiter, causes the color of the diamond to more closely approach colorless on the GIA color scale). For example, illustrative embodiments may use boron to counteract the yellow color and may additionally add silicon to the growth environment to stabilize the other colors, resulting in a more neutral color.

In illustrative embodiments, a third dopant (e.g., in addition to the nitrogen and boron dopants) is added to the diamond. In some embodiments, the diamond may be grown with a homogeneous mixture of the three dopants in varying proportions. However, in some other embodiments, where the crystal is grown in layers, the third dopant may be added to the crystal layer containing nitrogen, the crystal layer containing boron, and/or to a sequential crystal layer. For example, the addition of silicon on top of, or in to, the nitrogen-doped crystal layer and/or the boron-doped crystal layer may produce a red discoloration, which lessens the optical impact of the green tint to the appearance of the diamond (e.g., caused by the nitrogen and the boron in the crystal). While further discussion may refer to layer growth of diamond crystals, it should be understood that some embodiments may grow a homogeneous diamond (e.g., a gemstone) that is not grown in layers.

Accordingly, illustrative embodiments grow diamond crystals using at least three dopants. In some embodiments, the dopants are introduced in parallel in the growth cycle. For example, a given crystal layer may be doped with one or more of the dopants. In some other embodiments, the dopants are introduced sequentially in the growth cycle. Specifically, a series of given crystal layers may be doped with various combinations of one or more of the dopants. For example, two dopants may be introduced during one part of the process (e.g., boron and nitrogen), and then two other dopants (e.g., nitrogen and silicon) may be introduced during a different part of the process.

Although discussion refers to crystal layers, it should be understood that the discussion of crystal layers is applicable to diamond layers. Thus, any discussion referring to a crystal layer applies to a diamond layer, unless stated otherwise. It should be understood that some layers may contain one dopant or no dopants. Yet other layers may contain at least two dopants (e.g., three dopants). Regardless of the number of dopants introduced in any particular layer, it is possible to proceed in a stepwise manner, by adjusting the concentration of the dopant at each layer, so as to determine the overall effect on the color of the diamond crystal super-lattice. Thus, in some embodiments, the concentration of a first dopant may be increased relative to the concentration of a second dopant and/or third dopant, or vice-versa.

Figure 1:
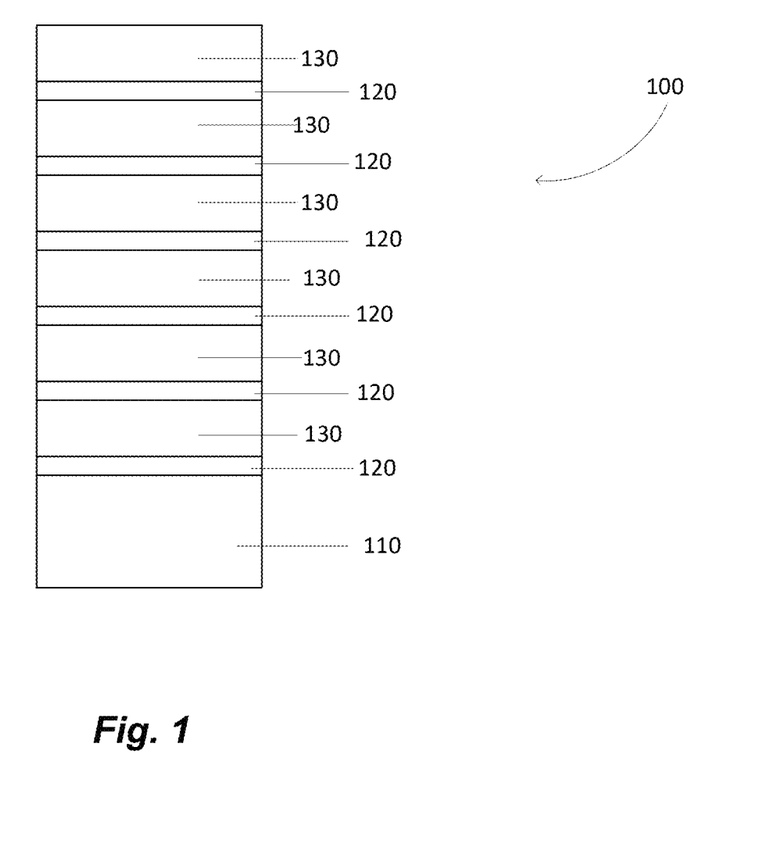
FIG. 1 schematically shows a super-lattice including doped diamond layers, in accordance with illustrative embodiments of the invention.

FIG. 1 schematically shows a super-lattice 100 including doped diamond layers 130, in accordance with illustrative embodiments of the invention. As known by those in the art, the super-lattice 100 is a periodic structure of different lattices (e.g., layers) of two or more different materials. In illustrative embodiments, the super-lattice 100 includes a base 110, and periodic/repeating layers of sacrificial layer 120 and one or more diamond layer 130. Accordingly, in the example of FIG. 1, the super-lattice 100 has periodic layers formed by the sacrificial layer 120 and the diamond layer 130. The layers 120 and 130 preferably are grown by epitaxially deposition, e.g., heteroepitaxially deposited.

While illustrative embodiments may refer to the super-lattice 100, it should be understood that embodiments are not limited thereto. For example, a person of skill in the art reading this disclosure should understand that the disclosure described herein may be applicable to homoepitaxy (e.g., for gemstones). Accordingly, in various embodiments, some or all of the sacrificial layers 120 (e.g., between diamond layers 130) are optional.

Each sacrificial layer 120 includes one or more sacrificial material layers. For example, the sacrificial layer 120 may include a top sacrificial material layer onto which a diamond layer 130 is formed, and one or more sacrificial material layers underlying the top sacrificial material layer. Some embodiments may use these additional sacrificial layers 120 to facilitate wafer separation. Additionally, or alternatively, the sacrificial layer 120 may include a sandwich of substrate material, e.g., iridium-magnesium oxide-iridium. Moreover, there is no requirement that every sacrificial layer 120 be identical.

It should be understood that although illustrative embodiments refer to the sacrificial layer 120, some embodiments are not limited to having one more sacrificial layers. Indeed, some embodiments may have no sacrificial layer 120. Alternatively, some other embodiments may only have a single sacrificial layer (e.g., contacting the base 110). Discussion of the sacrificial layers 120 is merely intended to facilitate discussion of some illustrative embodiments. Indeed, preferred embodiments may lack sacrificial layers 120 between diamond layers 130, in order to grow a larger unitary diamond gem.

In illustrative embodiments the diamond layer 130 is a doped diamond layer. For example, the diamond layer 130 may be doped with boron, nitrogen, aluminum, germanium, silicon, phosphorous, and/or arsenic, among other things.

Figure 2:
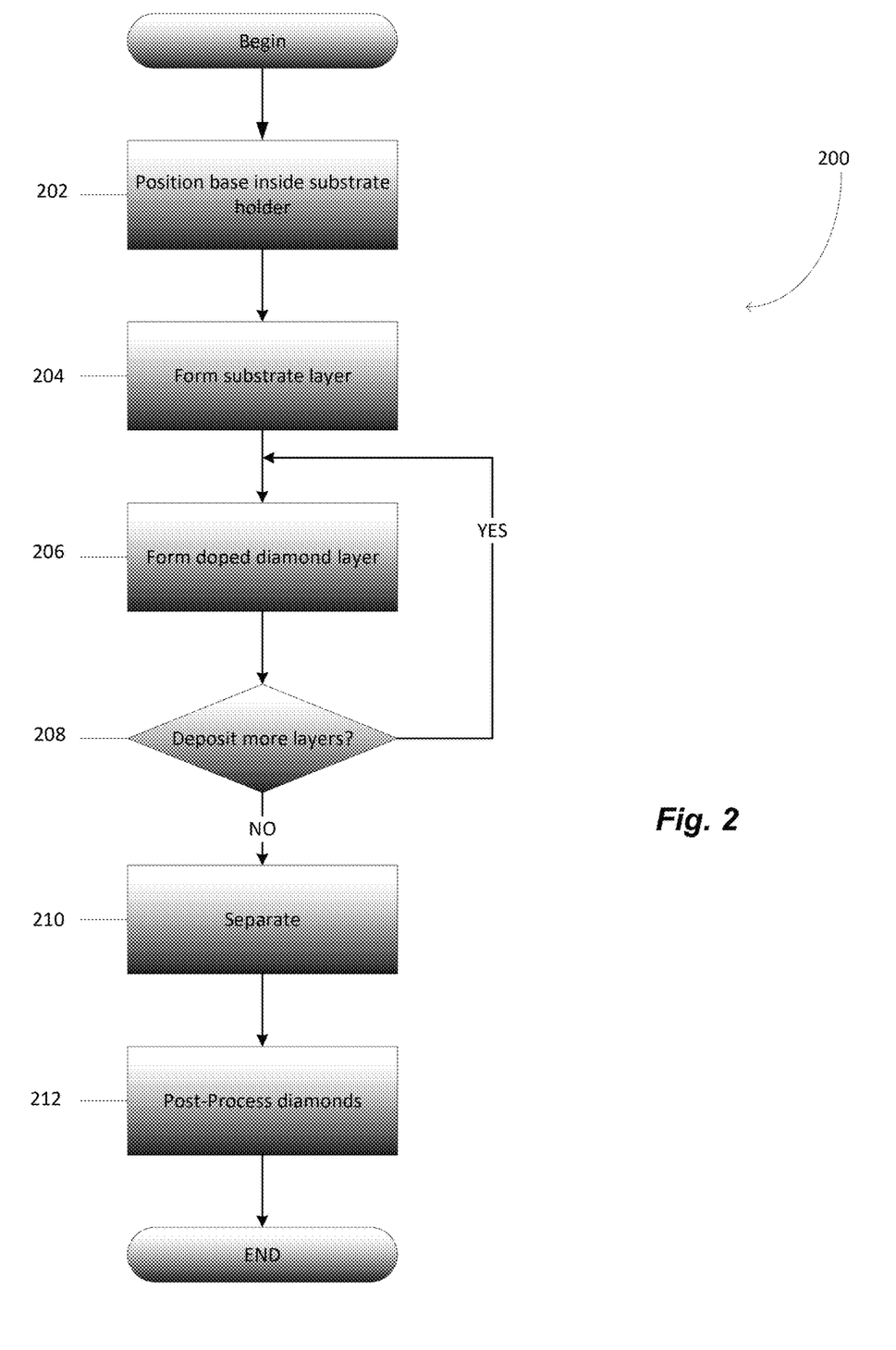
FIG. 2 shows a flowchart schematically illustrating a process of forming doped diamond layers, in accordance with illustrative embodiments of the invention.

FIG. 2 shows a process 200 of forming the doped diamond layers 130 in accordance with one exemplary embodiment of the invention. It should be noted that this method is substantially simplified from a longer process that may normally be used. Accordingly, the method of FIG. 2 may have many other steps that those skilled in the art likely would use. In addition, some of the steps are optional (e.g., step 204) and/or may be performed in a different order than that shown, or at the same time. Furthermore, some steps may be optional. For example, some embodiments may skip steps 202, 204, and/or 210. Those skilled in the art therefore can modify the process as appropriate.

Moreover, as noted above and below, many of the materials and structures noted are but one of a wide variety of different materials and structures that may be used. Those skilled in the art can select the appropriate materials and structures depending upon the application and other constraints. Accordingly, discussion of specific materials and structures is not intended to limit all embodiments. Additionally, it should be understood that discussion referencing the doped diamond layers 130 is intended to encompass diamond layers 130 that include different dopants and/or different concentrations of dopants (e.g., that are not necessarily identical). Diamond layers 130A-130E are referred to in the discussion below, but this is not intended to limit discussion of the diamond layer 130 to identical layers (e.g., a first diamond layer 130 may be doped with boron, and a second diamond layer 130 may be doped with silicon).

The process may be executed inside a furnace, reactor, or other device (not shown) having a chamber defining a growth environment. The growth environment has carefully controlled conditions, such as prescribed pressures, temperatures, and gas concentrations. For example, the process may be carried out using the chemical vapor deposition ("CVD") method. However, advantages of the invention may be achieved by using other methods of growing or manufacturing diamonds not explicitly described herein.

The process begins at step 202, which positions the base 110 inside a cavity of a substrate holder within the chamber. Details of an exemplary substrate holder and how to position the base therein are described in International Patent Application No. PCT/US2018/050061, the contents of which is incorporated herein, in its entirety, by reference. Illustrative embodiments may package the base 110 already positioned inside the substrate holder. Among other things, the base 110 may be formed from, for example, magnesium oxide, iridium, silicon, yttrium-stabilized zirconium, titanium, silicon carbide, diamond, or combinations thereof. Those skilled in the art may select yet a different material for the base 110. Preferably, the base 110 has a single crystal/monocrystalline structure.

After the base 110 is positioned and/or formed in the substrate holder, step 204 epitaxially forms a sacrificial layer 120 on the base 110. Among other ways, illustrative embodiments may use atomic layer deposition, or other vapor chemical deposition technique. Those skilled in the art may use still other known techniques to form the sacrificial layer 120. The sacrificial layer 120 preferably is constructed and formed from a material that may be more easily removed by subsequent wafer separation techniques (discussed below). Those skilled in the art therefore should engineer the sacrificial layer 120 based on the anticipated separation technique to separate the ultimately formed heteroepitaxially formed super-lattice 100.

Epitaxial deposition causes the deposited sacrificial layer 120 to take on a crystalline structure bearing similar lattice constants of underlying base 110, which, in illustrative embodiments, is monocrystalline (also referred to as "single-crystal"). As noted above, the sacrificial layer 120 may be a metal, such as single-crystal iridium or titanium. As also noted above, the sacrificial layer 120 may be comprised of a plurality of different materials and/or layers to facilitate separation of the ultimately formed diamond layers 130.

Next, after forming the first sacrificial layer 120, step 206 forms the first doped diamond layer 130 on the sacrificial layer 120. Again, this step may use conventional deposition techniques to form or deposit this and other diamond layers 130. In some embodiments, one or more of the following elements or molecules may be added into the chamber (e.g., in the form of a gas, solid target, etc.) to dope the diamond layer: nitrogen, boron, sulfur, silicon, cobalt, germanium, aluminum, nickel, phosphorous, arsenic, chlorine, oxygen, fluorine, argon, ammonia, carbon monoxide, carbon dioxide, fluorinated gas (e.g., xenon difluoride ($XeF_2$), sulfur hexafluoride ($SF_6$), or chlorodifluoromethane ($CHClF_2$)), and/or boron containing gas (e.g., borazine ($B_3H_6N_3$), diborane ($B_2H_6$), or boron trichloride ($BCl_3$)). In some embodiments, the dopant element is introduced via a molecule that contains the dopant element, along with other elements. For example, silicon may be introduced via silane ($SiH_4$). The silane is decomposed in the chamber into silicon and hydrogen. Accordingly, the first doped diamond layer 130 is epitaxially formed on the first sacrificial layer 120A, which causes the diamond layer 130 to be a single-crystal layer.

During growth using CVD processes, for example, it may be helpful to initially modify diamond growth to initiate diamond growth while suppressing formation of other carbon allotropes, as well as crystal domains. To that end, among other things, the process may use ion bombardment or substrate biasing at this point in the process.

During epitaxy, the diamond layer 130 and/or the sacrificial layer 120 may experience strain. In fact, some embodiments may be engineered so that the sacrificial layer 120 is strained more than the diamond layer 130. Generally, strained material is easier remove in a subsequent etching process or other related process. Furthermore, engineering strain on the sacrificial layer 120 may also remove or mitigate some strain from the diamond layer 130, thus reducing the number of defects in the diamond layer 130. To expedite the process, various embodiments may use two separate growth chambers-one for adding the sacrificial layer 120 and another for forming the diamond layer 130 on the sacrificial layer 120.

The next step 208 determines if more layers should be deposited on the super-lattice 100. For example, more diamond layers 130 may be deposited if the diamond does not have a desired color or size. If more layers are to be deposited, then the process may optionally return back to step 204, and epitaxially forms a second sacrificial layer 120B on the first diamond layer 130A. The process then continues to step 206 to epitaxially form a second doped diamond layer 130B (e.g., on the second sacrificial layer or on the first doped diamond layer 130A).

Figure 3A:
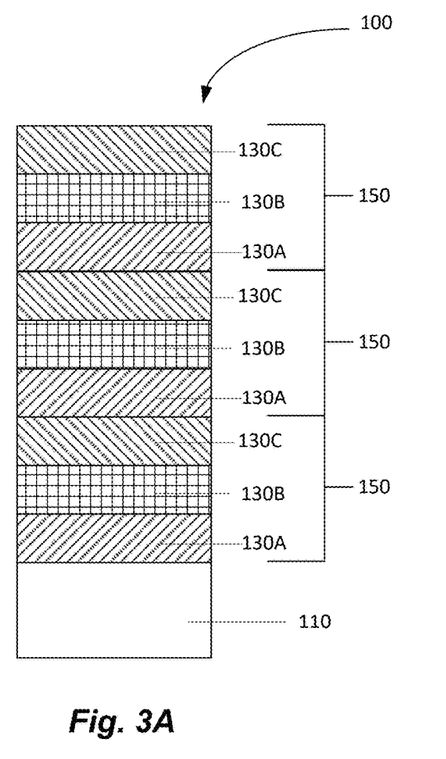
FIG. 3A schematically shows a second diamond layer formed on a first diamond layer in accordance with illustrative embodiments of the invention.

FIG. 3A schematically shows a second diamond layer 130B formed on a first diamond layer 130A in accordance with illustrative embodiments of the invention. At step 206 a second doped diamond layer 130B is formed. The second doped diamond layer 130B may be include the same or different dopant from the first doped diamond layer 130A. Preferably, the second doped diamond layer 130B includes a dopant that counteracts the color from the first doped diamond layer 130A.

Although layers 130A and 130B are considered to have different dopants, as a practical matter, it can be difficult to entirely remove any trace of a particular dopant from the growth environment, and thus, from grown diamond layers. Therefore, while layers 130A and 130B are doped with "different" impurities, they may both contain at least some trace of the same dopants, but in largely varying concentrations. This is known by those skilled in the art, for example, as "unintentional doping." Unintentional doping may occur because of residual traces of a particular dopant in the chamber. Thus, for purposes of this application, layers may be considered to have different dopants even if a trivial amount of a particular dopant is present in both layers relative to another dopant. A trivial amount of a dopant may be 5% of the concentration of a primary dopant, or less. A dopant present in trivial amounts does not detectably change the color of the layer 130.

Furthermore, in some embodiments, all of the dopants may be present in varying concentrations through differing layers 130A and 130B while still achieving different colors in the different layers 130A and 130B. This is because, as described previously, the addition of one dopant may lessen the optical impact of another dopant (e.g., nitrogen-doped crystal layer may produce a blue discoloration, which lessens the optical impact of the yellow nitrogen discoloration).

The process then proceeds to step 208 again, which asks if more layers should be deposited. This process described may be repeated until a satisfactory number of layers are deposited. For example, as shown in FIG. 3A, a third diamond layer 130C may be deposited on the second diamond layer 130B. Preferably, the third layer 130C improves the color of the diamond. Thus, as an example, the first layer 130A and the second layer 130B may be doped with nitrogen and boron, and the third layer 130C may be doped with silicon. The three diamond layers 130A, 130B, and 130C may define a repeating periodic unit 150 of the super-lattice 100. Although three diamond layers 130A-130C are shown as forming the periodic unit 150, it should be understood that more or fewer layers may form the periodic unit 150.

Thus, the process repeatedly epitaxially forms periodic layers of substrate-diamond as desired. For example, this process may form 2-100 diamond layers 130. Some embodiments may form between 10-90 diamond layers 130, between 20-80 diamond layers 130, or between 50-70 diamond layers 130, etc. In some embodiments, between 1,000 and 10,000 doped layers 130 (e.g., nanometer scale in thickness) may be formed. Some embodiments may be grown using the process described in provisional U.S. patent application Ser. No. 62/963,231, filed Jan. 20, 2020, which is incorporated herein by reference in its entirety. That process may be modified to grow large diamonds of a desirable color by introducing dopants into the growth process as described herein.

By performing this iterative process, illustrative embodiments heteroepitaxially form a diamond/sacrificial super-lattice 100 that may be used to produce individual diamond wafers. This process favorably enables those in the art to produce larger diamond wafers than those formed using conventional homoepitaxial processes known to the inventors. For example, homoepitaxial processes known to the inventors typically can be no larger than about 1 inch in diameter absent mosaicking or other similar undesirable processes.

In some other embodiments, illustrative embodiments may form a diamond gemstone. Accordingly, the diamond may be grown (e.g., in layers) without sacrificial layers.

As described previously, each of the diamond layers 130A-130C may include a different impurity/dopant. For example, the first diamond layer 130A may include nitrogen, the second diamond layer 130B may include boron, and the third diamond layer 130C may include silicon. It should be understood that the impurities/dopants in each layer 130A-130C are merely illustrative, and the doped layers 130A-130C may be rearranged in any order. Furthermore, additional or fewer layers 130 may form the periodic unit 150. This process of depositing layers may be continued until a diamond is grown that has a satisfactory color and size. In order to introduce the various described dopants into each diamond layer 130, the growth chamber may have, for example, gas containing the dopant pumped into the growth chamber.

Figure 3B:
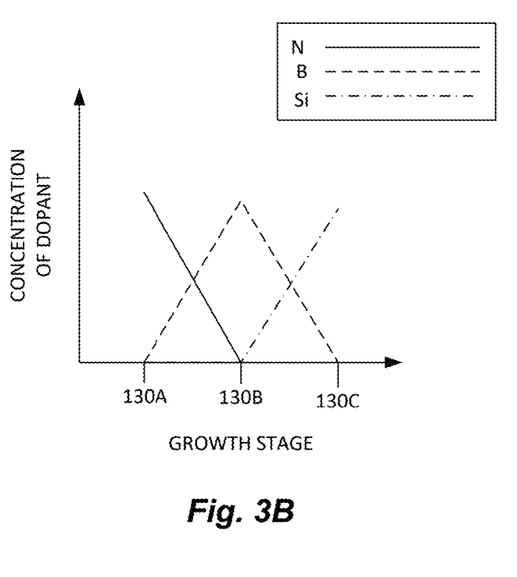
FIG. 3B schematically shows a graph of an example of concentrations of various dopants in a CVD growth environment during various growth stages of crystal layers shown in FIG. 3A.

FIG. 3B schematically shows a graph of an example of concentrations of various dopants in a CVD growth environment during various growth stages of crystal layers shown in FIG. 3A. In some embodiments, the concentrations of various dopants may be altered over time. For example, concentrations of boron may be about 0 ppm at the beginning of the growth cycle (e.g., formation of layer 130A), and may slowly ramp up. Additionally, concentrations of silicon may remain at 0 ppm until a particular stage of the growth cycle (e.g., formation of 130B) and then ramp up. As a further example, concentrations of nitrogen may start high at the beginning of the growth cycle and decline during later stages of the growth process.

As another example, at the time that layer 130A is grown, nitrogen may be at its highest concentration, and boron and silicon concentrations may be at or approximately zero. The nitrogen may then be pumped out of the growth chamber, while boron is pumped into the chamber. At the time that the second diamond layer 130B is grown, nitrogen concentrations may be substantially reduced or non-existent. Then, both nitrogen-containing gas and boron-containing gas may be pumped out of the chamber, and silicon-containing gas may be pumped into the chamber. Accordingly, at the time the third diamond layer 130C is grown, the diamond layer is considered silicon-doped. These concentration cycles may be repeated as each periodic unit 150 is grown layer by layer.

As described previously, there may be some small concentration of nitrogen and/or boron remaining in the chamber that may cause unintentional doping. The effect of these dopants on the overall gem color and the layer is considered negligible because of the very small layer concentration. Illustrative embodiments intentionally change the concentrations of dopants by injecting/pumping in dopants into the growth environment to substantially increase the concentration. Furthermore, illustrative embodiments intentionally change the concentrations of dopants by intentionally removing/pumping out dopants from the chamber.

In the example of FIG. 3B, when layer 130A is grown, nitrogen is a primary dopant. If there are any traces of boron and silicon, they may be considered secondary and tertiary dopants (depending on which has a higher concentration, if any). At the time layer 130B is grown, boron is the primary dopant. However, it is likely that at least some residual nitrogen remains in the chamber even after the gas is pumped out. In a case where a secondary dopant, tertiary dopant, etc. interferes with the desired color properties of a layer caused by the primary dopant, the concentration of the primary dopant may be increased to compensate for the effect of the other dopant(s).

Furthermore, although the concentration of dopant is represented as a curve, it should be understood that the curves are not intended to limit various embodiments. In some embodiments the rate of change of dopants may differ from what is shown, may remain substantially constant throughout the entirety of the formation of the layer, and/or all of the gas may be pumped out after the formation of each independent layer. For example, see FIGS. 3E-3G.

Figure 3C:
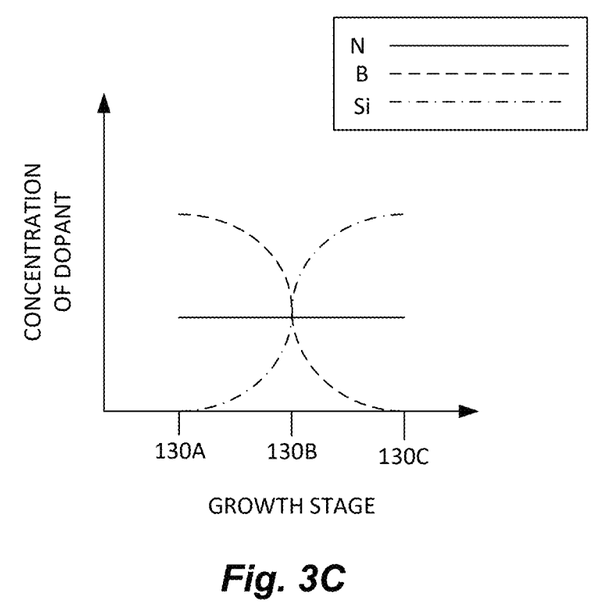
FIG. 3C schematically shows a graph of another example of concentrations of various dopants during various growth stages of crystal layers shown in FIG. 3A.

FIG. 3C schematically shows a graph of another example of concentrations of various dopants during various growth stages of crystal layers shown in FIG. 3A. As discussed previously, nitrogen may be intentionally or accidentally introduced into the growth process. Accordingly, in some embodiments, nitrogen may be present throughout all of the growth stages. Thus, as the various diamond layers 130A-130C are grown, they may contain nitrogen impurities. In illustrative embodiments, boron concentrations may start high and then gradually taper during the growth process. In contrast, silicon concentrations may be low (or zero) and then gradually taper upward during the growth process. It should be noted that in the embodiment shown in FIG. 3C, the first layer 130A contains primarily two dopants, the second layer 130B contains three dopants, and the third layer 130C primarily contains two dopants. In some embodiments, the concentration of the one or more dopants may be between about 0 ppm and about 1000 ppm for each of the dopants. More specifically, some embodiments may have one or more dopants in concentrations of 10 ppm to 100 ppm. Some other embodiments have dopant concentrations of 100 ppm to 1000 ppm.

When layer 130A is grown, boron is a primary dopant, nitrogen is a secondary dopant, and silicon may be a tertiary dopant (if present at all). When layer 130B is grown, the concentrations of all three dopants is approximately equal, and therefore, the layer can be said to have three primary dopants. When layer 130C is grown, silicon is the primary dopant, nitrogen is the secondary dopant, and silicon is the tertiary dopant.

Figure 3D:
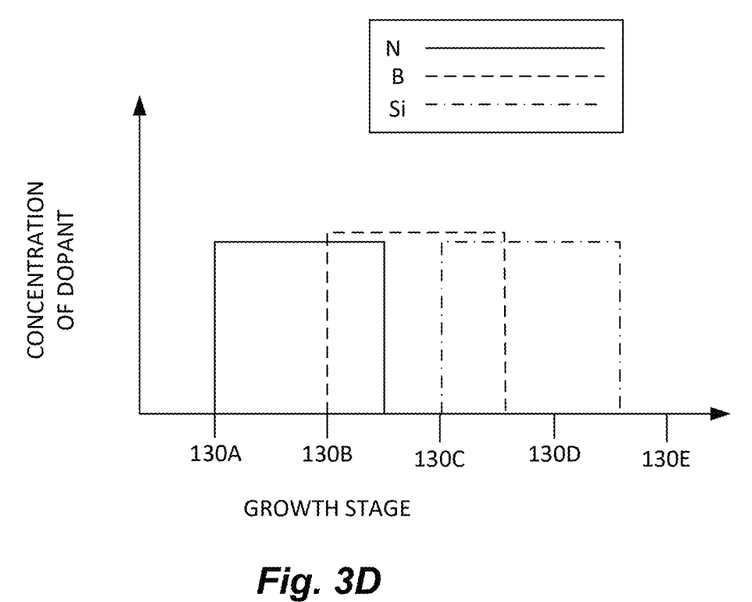
FIG. 3D schematically shows a graph of yet another example of concentrations of various dopants during various growth stages of crystal layers in accordance with illustrative embodiments of the invention.

FIG. 3D schematically shows a graph of yet another example of concentrations of various dopants during various growth stages of crystal layers. In this example, the growth stages are extended to include additional diamond layers 130D and 130E. In some embodiments, the concentration of dopants may be staggered. Thus, some layers (e.g., 130A and 130D) may include a single dopant, some layers may include two dopants (e.g., 130B and 13C), and some layers may include no dopants (e.g., 130E). The layers 130A-130E may form the periodic unit 150. Even though each layer may contain a different color characteristic, the cumulative effect of the dopants in all of the layers (e.g., in the super-lattice 100) may produce an overall desirable color characteristic (e.g., to the human eye).

To achieve the various concentrations of dopant described above, the flow rate of the various dopants pumped into the CVD chamber may be adjusted during the growth process. Furthermore, although illustrative embodiments discuss the use of nitrogen, boron, and silicon dopants, it should be understood that alternative or additional dopants may be used. For example, in some embodiments phosphorous or arsenic may replace nitrogen, germanium may replace silicon, and/or aluminum may replace boron.

Figure 3E:
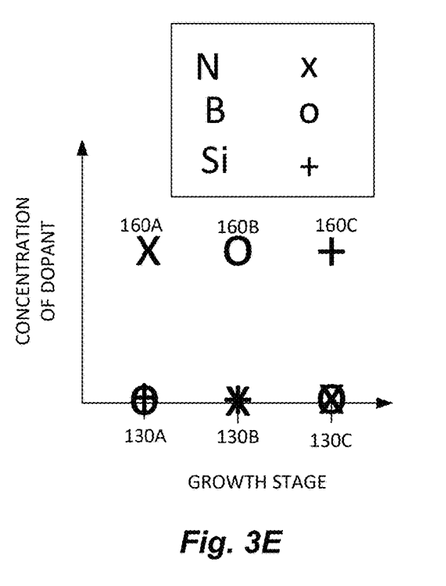
FIGS. 3E-3G schematically show graphs of various dopant concentrations during various growth stages of crystal layers in accordance with illustrative embodiments of the invention.
Figure 3F:
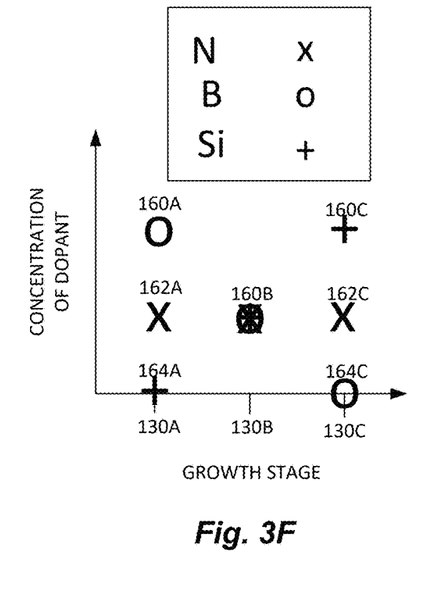
Figure 3G:
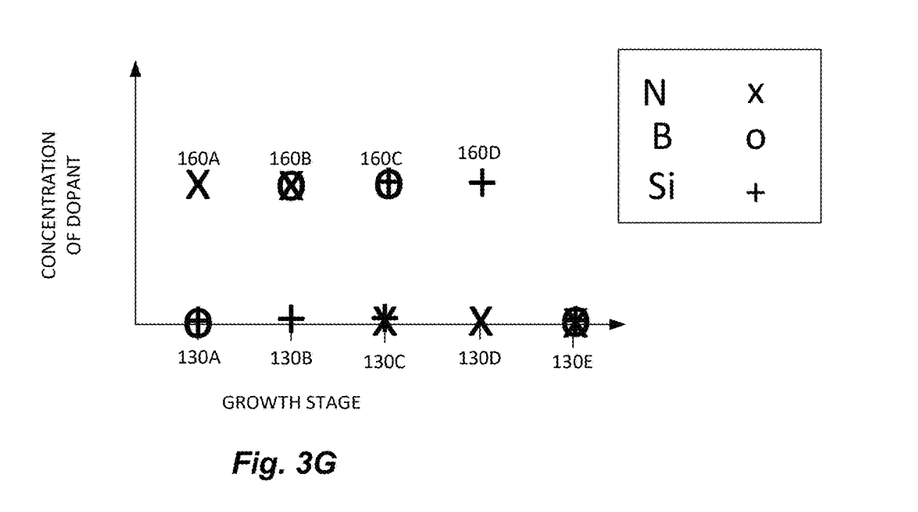

FIGS. 3E-3G schematically show graph of examples of concentrations of various dopants. The concentration of dopants during the growth of various layers in FIGS. 3E-3G substantially track the concentrations shown in FIGS. 3B-3D, respectively. However, the concentrations are shown as impulses, rather than curves, when the layers are grown. Because of the varying concentrations of dopants, each layer 130A-130C may have a primary dopant 160A-160C, a secondary dopant, a tertiary dopant, etc.

For example, as shown in FIG. 3E, layer 130A may have a primary dopant 160A caused by a proportionally large concentration of nitrogen throughout the growth of layer 130A. Concentrations of boron and silicon may be zero or negligible.

FIG. 3F schematically shows an example of the layer 130A where boron is the primary dopant 160A, nitrogen is the secondary dopant 162A, and silicon is the tertiary dopant 164A. However, during the growth of the second layer 130B, the concentrations of boron and nitrogen change. For example, after layer 130A is grown, the dopant may be removed (e.g., pumped out of chamber) from the growth environment and new dopant may enter (e.g., pumped into chamber) the growth environment. Thus, as layer 130B is grown, approximately identical concentrations of boron, nitrogen, and silicon may be present in the chamber. In this example, when concentrations of dopants are substantially equal, there are three primary dopants 160B. In a similar manner, after layer 130B is grown, the gas may again be pumped out and a new concentration of gases may be pumped into the chamber. At growth stage 130C, silicon is the primary dopant 160C, nitrogen is the secondary dopant 162C, and boron is the tertiary dopants 164C.

In the example of FIG. 3G, nitrogen is the primary dopant during the grown of layer 130A; boron and nitrogen are the primary dopants during the growth of layer 130B; silicon and boron are the primary dopants during the growth of layer 130C; and silicon the primary dopant during the growth of layer 130D. One of skill in the art may vary the concentrations of primary, secondary, and tertiary dopants to achieve various colors and other properties as desired.

Returning to FIG. 2, if the process has formed the desired number of diamond layers 130, then step 210 separates the diamond layers 130 from the one or more sacrificial layers 120 to form a plurality of free-standing, single crystal diamond substrates/films 132. Illustrative embodiments may use one or more conventional separation processes, such as chemical, thermal, vapor, and dry etching processes. In some embodiments, an acid bath separates the diamond layers 130. For example, the process may use a hot aqua regia to etch the sacrificial layers 120 and separate the diamond layers 130. Other types of acid baths may also be used with chemistries specifically chosen to etch the specific material (s) forming the sacrificial layers 120. For example, certain chemical etching processes may use hydrofluoric acid (HF) or xenon difluoride ($XeF_2$). Indeed, those skilled in the art may select other appropriate separation techniques and thus, the noted techniques are illustrative and not intended to be limiting to all embodiments.

In some embodiments, the super-lattice 100 may be packaged and shipped to a remote site before the diamond layers 130 are separated. The diamond layers 130 can then be separated at the remote site to reduce the risk of damage during shipping.

While illustrative embodiments have described the use of sacrificial layers 120, it should be understood that some embodiments may build a diamond gemstone using the doping process described herein without the use of the sacrificial layers 120, or by using a single sacrificial layer 120. For example, some layers may be built directly on one another. Additionally, or alternatively, some embodiments may have a single sacrificial layer 120 on the base 110 on which diamond growth is started without further sacrificial layers 120. Therefore, in some embodiments, step 210 may be skipped entirely or just a single sacrificial layer 120 may be separated.

The process concludes at step 212, which post processes the diamond (e.g., the diamond gemstone or separated wafers 132). For example, the process may polish or anneal one or both sides of the resulting diamonds depending on their ultimate application. For example, one side of the diamond wafers may be polished, and/or the diamond wafers may be doped for some downstream application. Other post-process may cut the diamond wafers into pre-scribed sizes or shapes.

Accordingly, recognizing shortcomings of other diamond production methods, such as homoepitaxial growth techniques, the inventors developed a method of producing diamonds having desirable color characteristics.

The embodiments of the invention described above are intended to be merely exemplary; numerous variations and modifications will be apparent to those skilled in the art. Such variations and modifications are intended to be within the scope of various embodiments.

The invention claimed is:

1. A method of forming a CVD diamond, the method comprising:
   providing a single-crystal substrate; and
   growing a first doped diamond layer directly or indirectly on the substrate, the first doped diamond layer including a first dopant, a second dopant, and a third dopant, each of the dopants being introduced into the CVD growth environment at non-trivial prescribed concentrations to produce a desired color that is closer to colorless on a diamond color scale relative to a diamond with any two of the three dopants, each of the three dopants being different from one another and being selected from the list of: boron, silicon, nitrogen, sulfur, phosphorous, chromium arsenic, nickel, germanium, cobalt, and aluminum.

2. The method of forming a CVD diamond of claim 1, wherein one of the first dopant, the second dopant, and the third dopant is a primary dopant, and another one of the first dopant, the second dopant, and the third dopant is a secondary dopant.

3. The method of forming a CVD diamond of claim 2, further comprising: adjusting the prescribed concentration of the first dopant, the second dopant, and/or the third dopant.

4. The method of forming a CVD diamond of claim 3, further comprising:
   growing a second doped diamond layer directly or indirectly on the first diamond layer after adjusting the prescribed concentration.

5. The method of forming a CVD diamond of claim 4, wherein the second doped diamond layer has a different color from the first doped diamond layer.

6. The method of forming a CVD diamond of claim 3, wherein adjusting the prescribed concentration of the first dopant, the second dopant, and/or the third dopant defines a new primary dopant.

7. The method of forming a CVD diamond of claim 4, further comprising:
   adjusting the prescribed concentration of the first dopant, the second dopant, and/or the third dopant; and
   growing a third doped diamond layer directly or indirectly on the second diamond layer after adjusting the prescribed concentration.

8. A method of forming a CVD diamond, the method comprising:
   providing a single-crystal substrate;
   providing a CVD growth environment in which there exists a gas comprising nitrogen;
   adding boron and silicon into the CVD diamond growth environment, wherein the boron and the silicon are added in a controlled manner into the CVD diamond growth environment to reduce a detrimental effect on color of the single crystal CVD diamond.

9. The method of forming a CVD diamond of claim 8, wherein the boron is removed from the CVD growth environment before the silicon is added.

10. The method of forming a CVD diamond of claim 8, further comprising growing a first diamond layer;
    reducing a concentration of the boron in the CVD growth environment prior to growing a second diamond layer;
    increasing a concentration of the silicon in the growth environment prior to growing the second diamond layer.

11. The method of forming a CVD diamond of claim 8, wherein the silicon is removed from the CVD growth environment before the boron is added.

12. The method of forming a CVD diamond of claim 8, wherein a concentration of the silicon in the CVD growth environment is reduced as a concentration of the boron is increased.

13. The method of forming a CVD diamond of claim 8, wherein the silicon and the boron are simultaneously present in the CVD growth environment.

14. The method of forming a CVD diamond of claim 8, further comprising growing alternating layers of primarily boron-doped diamond and primarily silicon-doped diamond.

15. The method of forming a CVD diamond of claim 14, wherein the primarily boron-doped diamond layer and the primarily silicon-doped diamond layer both include a secondary nitrogen dopant.

16. A method of forming a CVD diamond, the method comprising:
   providing a single-crystal substrate; and
   growing, by chemical vapor deposition, a doped diamond directly or indirectly on the single-crystal substrate, the doped diamond including a first dopant, a second dopant, and a third dopant, each of the dopants selected from the list of: boron, silicon, nitrogen, sulfur, chromium, phosphorous, arsenic, nickel, germanium, cobalt, and aluminum, the three dopants causing a color of the diamond to appear closer to colorless on a diamond color scale relative to a diamond with two of the three dopants.

17. The method of claim 16, wherein the doped diamond comprises a plurality of layers, each layer having at least one of the first dopant, the second dopant, and the third dopant.

18. The method of claim 16, wherein the doped diamond comprises a plurality of layers, each of the plurality of layers including a different primary dopant.

19. The method of claim 16, wherein the doped diamond comprises a plurality of layers, each of the plurality of layers including a different concentration of dopants.

20. The method of claim 16, wherein the dopants are added in a controlled manner into the CVD diamond growth environment.

* * * * *